US006885220B2

(12) United States Patent
Engl

(10) Patent No.: US 6,885,220 B2
(45) Date of Patent: Apr. 26, 2005

(54) CURRENT SOURCE CIRCUIT

(75) Inventor: Bernhard Engl, Miesbach (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/623,846

(22) Filed: Jul. 21, 2003

(65) Prior Publication Data

US 2004/0017249 A1 Jan. 29, 2004

Related U.S. Application Data

(63) Continuation of application No. PCT/DE02/00111, filed on Jan. 16, 2002.

(30) Foreign Application Priority Data

Jan. 19, 2001 (DE) ........................................ 101 02 443

(51) Int. Cl.[7] ............................................ H03K 19/094
(52) U.S. Cl. ........................ 326/115; 326/126; 326/127
(58) Field of Search ................................ 326/115, 126, 326/125, 119, 83, 86

(56) References Cited

U.S. PATENT DOCUMENTS

| | | | | |
|---|---|---|---|---|
| 4,937,517 A | | 6/1990 | Kurashima | |
| 4,975,631 A | | 12/1990 | Kurashima | |
| 5,306,964 A | * | 4/1994 | Taylor | 326/110 |
| 5,552,724 A | * | 9/1996 | Scott | 326/126 |
| 5,703,497 A | * | 12/1997 | Min | 326/33 |
| 5,767,699 A | * | 6/1998 | Bosnyak et al. | 326/86 |
| 5,986,479 A | * | 11/1999 | Mohan | 326/115 |
| 6,040,720 A | | 3/2000 | Kosiec | |
| 6,094,074 A | * | 7/2000 | Chi et al. | 326/115 |

* cited by examiner

*Primary Examiner*—Vibol Tan
(74) *Attorney, Agent, or Firm*—Laurence A. Greenberg; Werner H. Stemer; Ralph E. Locher

(57) ABSTRACT

A current source circuit is characterized in that it contains a control device that controls a component of the current source circuit that determines a variable of the current supplied by the current source circuit. The component is controlled in accordance with the conditions that prevail in the unit that is supplied by the current source circuit with current. The circuit is thus capable of continuously supplying a constant current without any limitations to its applications.

8 Claims, 7 Drawing Sheets

CURRENT SOURCE CIRCUIT

CROSS-REFERENCE TO RELATED APPLICATION

This application is a continuation of copending International Application No. PCT/DE02/00111, filed Jan. 16, 2002, which designated the United States and was not published in English.

BACKGROUND OF THE INVENTION

FIELD OF THE INVENTION

The present invention relates to a current source circuit.

By way of example, and as is known, but not exclusively, current source circuits are used in differential amplifiers, to be more precise as a foot current source for a differential pair of transistors.

FIGS. 1A, 1B and 1C show various embodiments of a configuration such as this.

In the illustrated circuits, the differential pair that has been mentioned in each case contains transistors T11, T12, and the foot current source has a transistor T2.

The foot current source supplies a foot current IT, which is also referred to as a tail current, to a common source node of the differential pair. A magnitude of the current (the magnitude of a voltage VB2 which controls the transistor T2) is normally produced via a transistor T2D (which is connected as a diode) and a current source IQ.

The circuitry on the drain side of the differential pair may, for example, contain load resistors R1, R2 (FIG. 1A), what is referred to as a folded cascode (FIG. 1B) or any desired circuit (FIG. 1C).

One major disadvantage of configurations of this type is that the tail current IT is dependent on inputs E+ (gate connection of the transistor T11), and E− (gate connection of the transistor T12) of the differential pair being driven in synchronism. The reason for this is the finite output conductance of the transistor T2, which may be very large, particularly in the case of modern CMOS processes with a channel length of 0.12 $\mu$m, thus resulting in major fluctuations in IT.

The conditions which occur at the common source node, to be more precise a potential Vs which occurs there, is also influenced from the drain side of the transistors T11 and T12, to be precise by finite output conductances of T11, T12, or by typical short-channel effects such as DIBL. These influences can be overcome by known measures such as drain-side cascodes (see, for example, FIG. 1B).

In principle, the foot current source T2 could also be cascoded (see FIG. 1C; cascode transistor T4), but a measure such as this restricts the synchronized drive range at E+, E−, since a further drain/source saturation voltage (the drain/source saturation voltage of T4) must be accommodated, and, with low typical supply voltages of 1.2 V or less, this is actually often no longer feasible.

SUMMARY OF THE INVENTION

It is accordingly an object of the invention to provide a current source circuit that overcomes the above-mentioned disadvantages of the prior art devices of this general type, in which errors in the foot current source of differential pairs or of other electrical circuits which are caused by the synchronized drive can be minimized without restricting the usage options.

With the foregoing and other objects in view there is provided, in accordance with the invention, a current source circuit. The current source circuit contains a component determining a magnitude of a current emitted from the current source circuit, and a control apparatus connected to and controlling the component. A control process is carried out in dependence on conditions prevailing in a unit supplied with the current from the current source circuit.

The current source circuit according to the invention is distinguished, in that the current source circuit contains a control apparatus which controls a component of the current source circuit, which component determines the magnitude of the current which is emitted from the current source circuit, and in that the control process is carried out in dependence of the conditions which prevail in the unit which is supplied with current from the current source circuit.

This makes it possible in a very simple manner to ensure that the current that is emitted from the current source circuit has the desired magnitude in all circumstances.

In accordance with an added feature of the invention, the component is a transistor.

In accordance with an additional feature of the invention, the control apparatus contains a current replication path in which a given current is caused to flow corresponding to the current, a specific multiple of the current, or a specific fraction of the current fed to the unit supplied with the current from the current source circuit.

In accordance with another feature of the invention, the current replication path contains a first transistor having a substrate, a first terminal being a gate terminal or a base terminal, a second terminal being a drain terminal or a collector terminal, and a third terminal being a source terminal or a emitter terminal. During operation of the first transistor, the first, second and third terminals are substantially at a same potential with respect to the substrate as at corresponding connections of the transistor governing the magnitude of the current emitted from the current source circuit.

In accordance with a further feature of the invention, the current replication path contains a second transistor having a terminal being a gate terminal or a base terminal. A drain or collector potential of the first transistor is set for driving the terminal of the second transistor in a suitable manner from the unit supplied with the current.

In accordance with a further added feature of the invention, the control apparatus contains a regulation apparatus, and the current replication path outputs a replicated current fed to the regulation apparatus. The regulation apparatus receives a nominal current, and the regulation apparatus readjusts the magnitude of the current emitted from the current source circuit and supplied to the unit such that the replicated current from the current replication path corresponds to the nominal current.

In accordance with another additional feature of the invention, the regulation apparatus contains at least one third transistor.

In accordance with a concomitant feature of the invention, the control apparatus is a control loop containing a first transistor, at least one second transistor, a third transistor, and at least two current sources. The component has a control terminal and an output. The first transistor has a first terminal being a gate terminal or a base terminal, a second terminal being a drain terminal or a collector terminal, and a third terminal being a source terminal or an emitter terminal. The second transistor has a first terminal being a gate terminal or a base terminal, a second terminal being a drain terminal or a collector terminal, and a third terminal being a source terminal or an emitter terminal. The third transistor has a first terminal being a gate terminal or a base terminal, a second terminal being a drain terminal or a collector terminal, and a third terminal being a source terminal or an emitter terminal. The second terminal of the first transistor is connected to the third terminal of the second transistor. The second terminal of the second transistor is connected to a first of the current sources and to the third terminal of the third transistor. The second terminal of the third transistor is connected to a second of the current sources, to the first terminal of the first transistor and to the control terminal of the component governing the magnitude of the current emitted from the current source circuit. The first and second current sources are used to supply a nominal current and to supply and return an operating current for the control loop. The first terminal of the second transistor is driven such that a potential at the second terminal of the first transistor is substantially a same as that at the output of the component.

Other features which are considered as characteristic for the invention are set forth in the appended claims.

Although the invention is illustrated and described herein as embodied in a current source circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 2A:
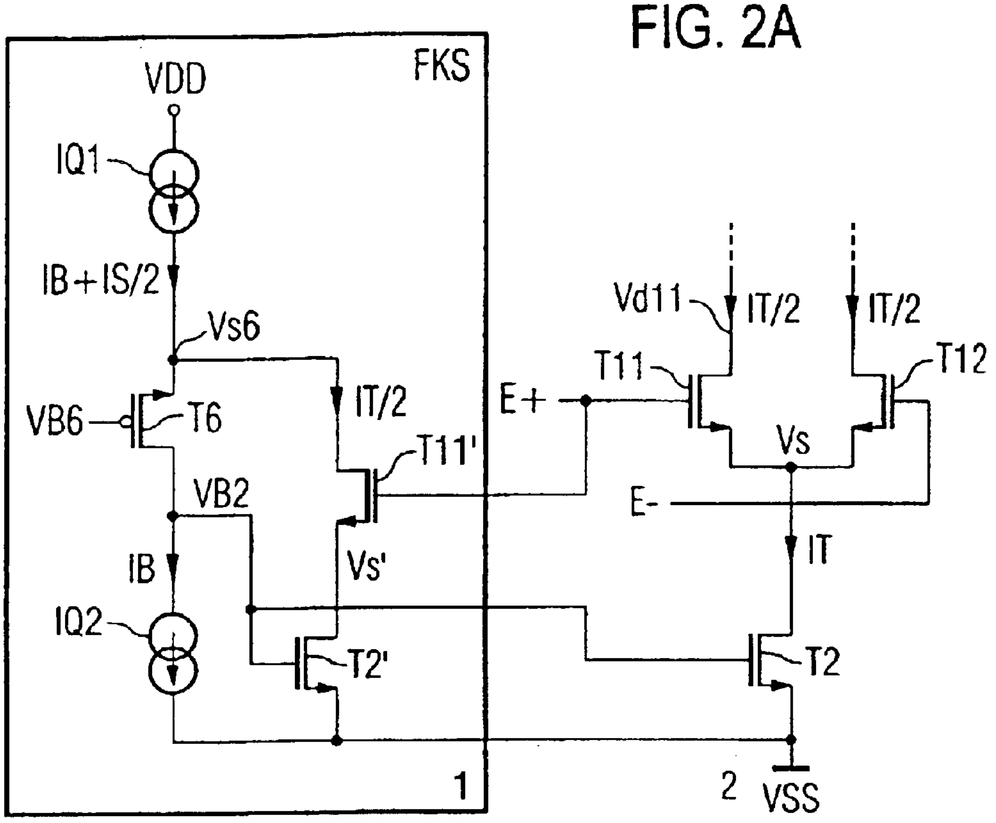
FIG. 2A is a circuit diagram showing a configuration which contains a differential pair and a current source circuit according to the invention.

Referring now to the figures of the drawing in detail and first, particularly, to FIG. 2A thereof, there is shown the basic idea of a current source circuit according to the invention with a number of possible modifications be shown in the other figures.

The configuration shown in FIG. 2A contains a circuit that is to be supplied with current and a current source circuit that supplies the circuit with the current. The current source circuit contains a component that determines the magnitude of the emitted current, and a control device that controls the component.

The circuit which is to be supplied with current in the example shown in FIG. 2A is a differential pair, containing transistors T11 and T12, with any desired circuitry on the drain side, but may also be any other desired circuit, as will be explained later with reference to examples.

That component of the current source circuit which determines the magnitude of the emitted current is, in the present case, a transistor T2 whose drain side is connected to the common source node of the transistors T11 and T12 and whose source side is connected to a supply voltage VSS; in some cases, this transistor is also referred to as the foot current source transistor T2 in the following text.

The control apparatus that controls the transistor T2 is a control loop that is annotated FKS in FIG. 2A and which, in the example shown, contains a first current source IQ1, a second current source IQ2 as well as transistors T6, T2' and T11'.

The transistor T2' is a replica transistor, onto which the common source potential Vs of the differential pair is mapped on the replica transistor T2', this at the same time being the drain potential of the foot current source transistor T2.

This is done via a transistor T11' that is connected in series with T2' (or via two or more transistors which are connected in series with T2'). A gate of the transistor T11' is driven such that the drain potentials Vs of T2 and Vs' of T2' are largely the same. The output current on the drain side of the series circuit formed by T2' and T11' in this case largely corresponds to a tail current IT of the differential pair, that is to say it is a replica of it, possibly scaled by a constant factor which is a result of the scaling of the transistor widths. In the example under consideration, the replicated current is, for example, IT/2 when T11 has precisely the width as T11' but T2 is twice as great as T2', with the same length of the transistors. The ratio 1:2 can be varied by varying the transistor geometries, although the only important factor for the best possible replication of the potential Vs in Vs' is that the current densities in the respective transistor pairs T2, T2' and T11, T11' are the same.

The already mentioned first current source IQ1 supplies the control loop with a current which corresponds to the sum of the (possibly scaled by a factor) nominal value IS of the foot current, in this case chosen by way of example to be IS/2, and the operating current IB of the control loop. Its operating current IB is drawn once again from the control loop via the second current source IQ2. The gate potential VB2 at the common gate connection of T2 and T2' rises when the replicated current IT/2 is less than the nominal current IS/2, and falls when it is greater than it. This control rule regulates the gate potential VB2 such that the tail current IT corresponds to the nominal current IS. The circuit topology allows very wide bandwidths, and is generally stable without any further measures, with the gate/source capacitances of T2 and T2' acting as a compensation capacitance.

In order to use the invention for differential pairs, it is sufficient to connect the gate connection of T11' to one of the inputs E+, E− of the differential pair, in order to pass the drain potential Vs from T2 as Vs' to the drain of T2'.

For operation of the current control loop according to the invention, there is no need for the source connections of the current source transistor T2 and of the replica transistor T2' to be connected directly to a supply voltage. It is sufficient for the source connections of T2, T2' to be at the same voltage with respect to their substrate. The invention can thus be used in a highly versatile manner.

The current control loop according to the invention containing T2', T6 and T11' as well as the current sources IQ1 and IQ2 can be used even without a differential pair, that is to say in an entirely general form, in order to remove errors caused by output conductances of current source transistors, when the gate T11' is driven by a case-specifically suitable circuit such that the drain potential Vs of the current source transistor T2, whose error is intended to be compensated for, is transferred to the drain potential Vs' of the transistor T2' in the current control loop. This more general situation is illustrated by way of example in FIG. 2B. Here, by way of example, an operational amplifier OP is used to transfer to the replica transistor T2' the drain potential Vs of the current source transistor T2 caused by the drive to the gate of T11'. It should be noted that the circuit shown by way of example and having the operational amplifier OP is not the only suitable way to achieve the potential transfer but that, on a case-by-case basis, other circuits may also be suitable for this purpose, depending on where the current source whose error is to be compensated for is located.

Figure 2B:
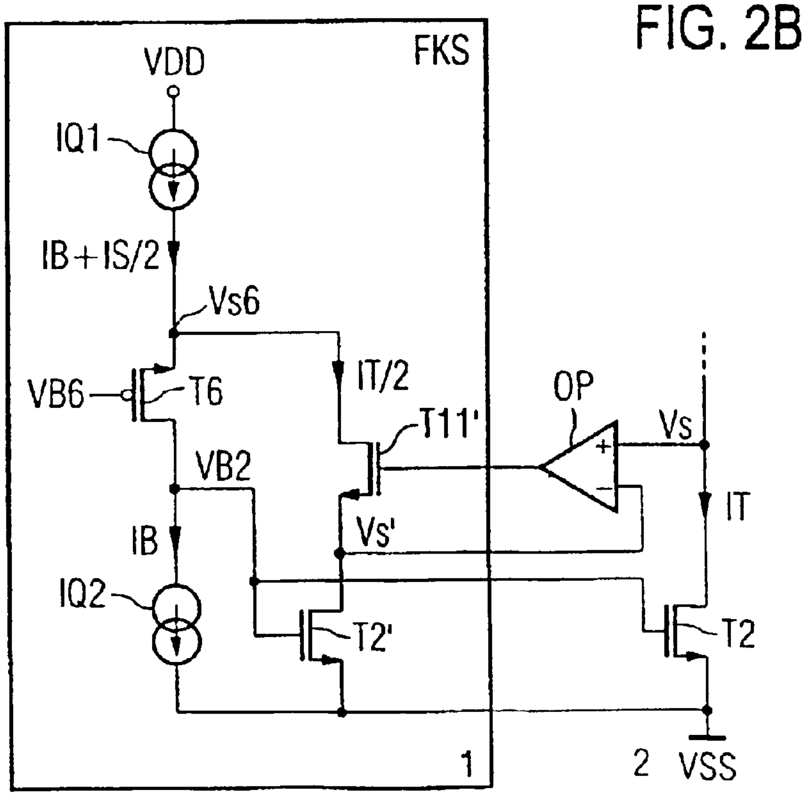
FIG. 2B is a circuit diagram showing the configuration shown in FIG. 2A, for the situation where another circuit is provided instead of the differential pair.

The example in FIG. 2B shows that the current source whose error has been compensated for by the current control loop according to the invention need not necessarily be connected to a differential pair as a current sink. However, if this is the case, the circuit according to the invention has the advantage that suitable configuration of the transistor geometries allows the replication of the potential Vs as Vs' at T2' to be carried out without any additional circuit components, such as the operational amplifier from FIG. 2B, thus resulting in minimum circuit complexity.

The control loop variant shown in FIG. 2A is preferably used in situations in which the differential pair is always in equilibrium in the steady state.

Figure 6:
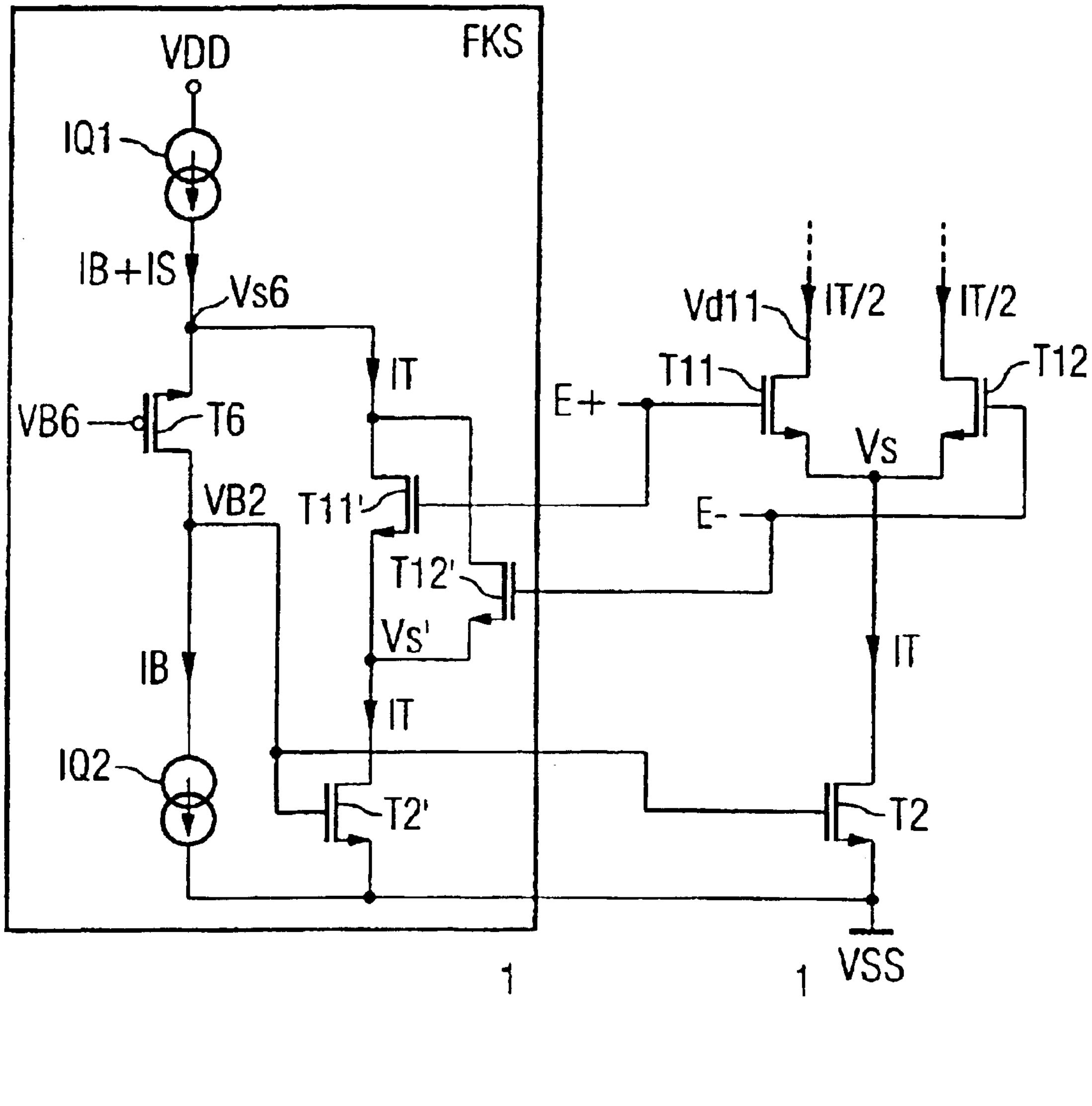

Another variant of the current control loop is shown in FIG. 6, which will be described in more detail later. This variant contains two control transistors, T11', T12' for the replication of the drain potential Vs, so that both inputs E+, E− of the differential pair are included in the regulation process. The control loop variant is preferable when the differential pair is not always operated in equilibrium. This situation occurs, for example, with fast analog/digital converters of the flash or folding type.

Figure 3:
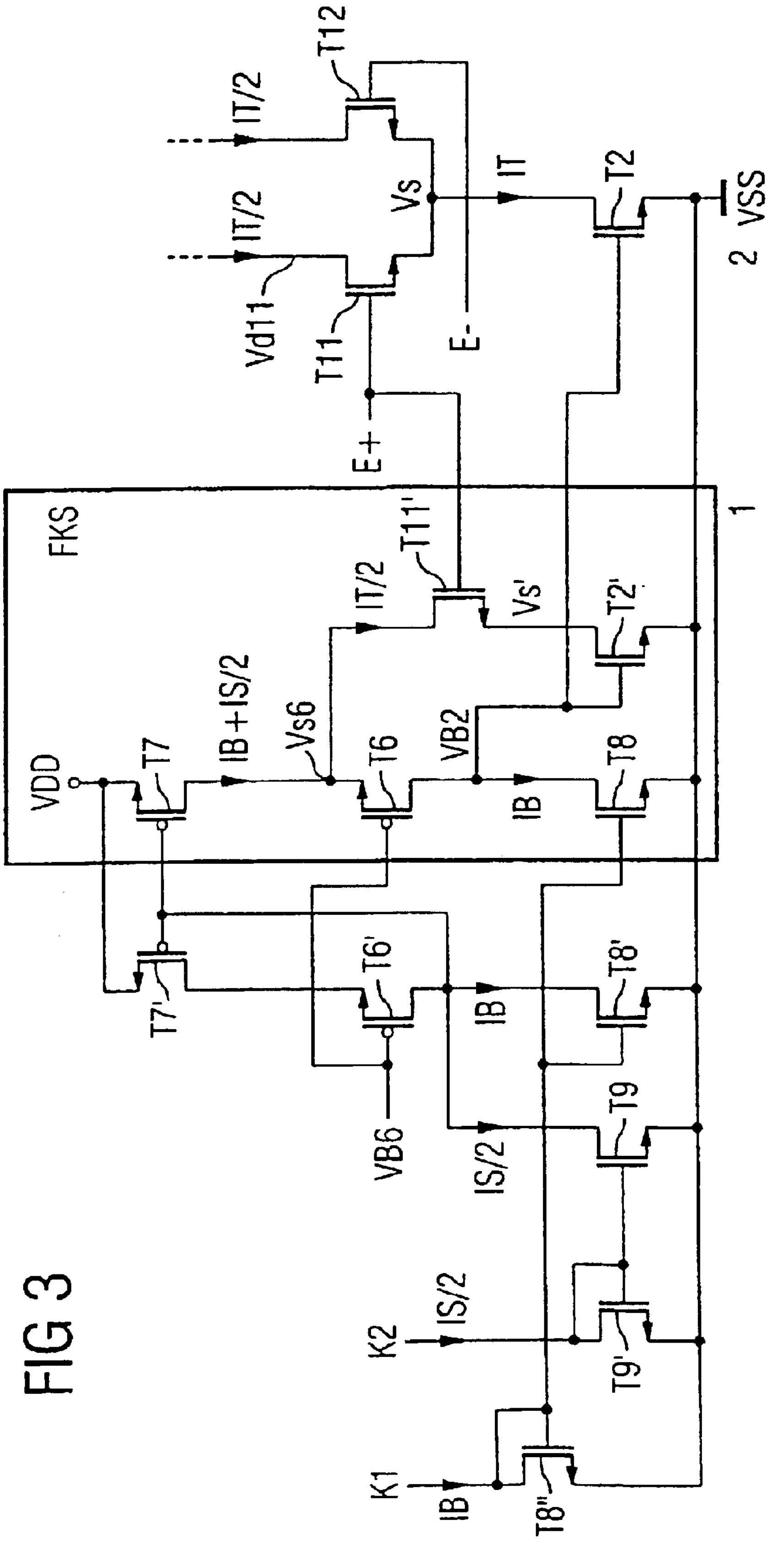
FIGS. 3 to 6 are circuit diagrams of a number of possible modifications to the configuration shown in FIG. 2A.

By way of example, FIG. 3 shows a practical implementation of the current control loop according to the invention, without ideal current sources IQ1, IQ2.

The current source IQ1 from FIGS. 2A, 2B, and 6 is in this case formed by a transistor T7 which, together with a transistor T7', forms a current mirror. In order to improve the characteristics of the current mirror T7, T7', a cascode transistor T6' is connected in series with T7', and its current density is preferably the same as that of the cascode transistor T6 in the current control loop. The cascode transistors T6, T6' are fed with a gate potential VB6 which sets the operating point of the cascode. The current source IQ2 from FIGS. 2A, 2B, and 6 is formed by a transistor T8. The operating current IB and the scaled nominal current IS/2 are fed to the circuit via two terminals K1, K2 as well as further current mirrors T8", T8', T8 and T9', T9. The summation of IB and IS/2 for the current source IQ1, that is to say for the transistor T7, takes place at the common gate connection of the transistors T7, T7'.

This implementation example of the current control loop according to the invention still has the disadvantage that the current mirrors are not cascoded at the terminals K1, K2. However, unless the requirements are relatively stringent, it is often sufficient in practice to ensure by suitable design of T2' and T8 that the gate potential of T8", T8', T8 is approximately the same as the potential VB2. This overcomes at least the error caused by finite output conductances of the transistors T8", T8', T8.

Figure 4:
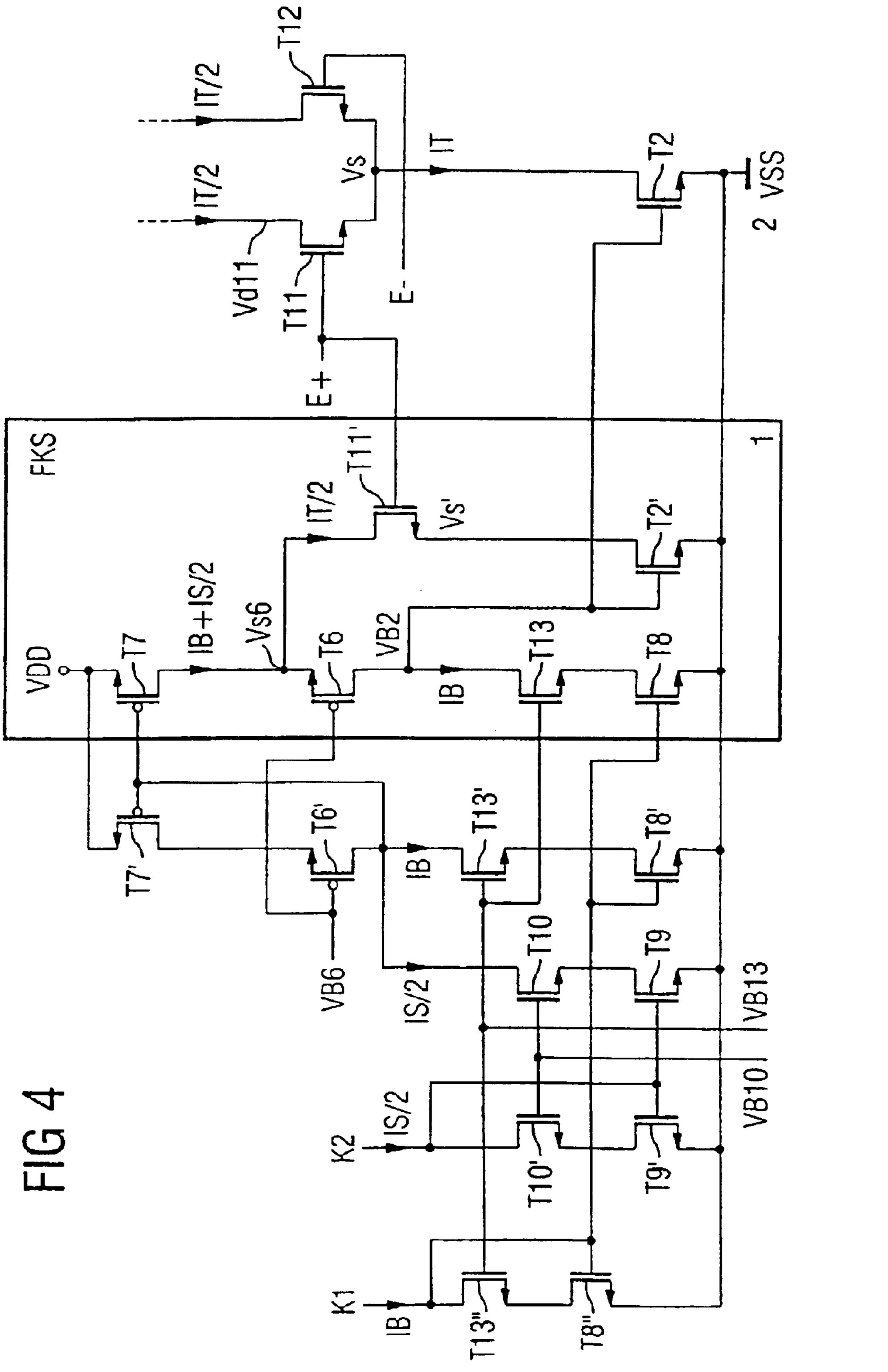

By way of example, FIG. 4 shows a circuit that is suitable for more stringent accuracy requirements, and which is based on that shown in FIG. 3, when the current mirrors which are connected to the terminals K1 and K2 are likewise cascoded. This is done using transistors T10, T10', which are connected in series with transistors T9, T9', as well as transistors T13, T13', T13", which are connected in series with transistors T8, T8', T8". The gate connections of T10, T10' are supplied with a gate potential VB10, in order to set the operating point of the cascode. The gate potential VB13 which is fed to the gate connections of T13, T13', T13" serves the same purpose. In this circuit, the drive range of the potential VB2 is admittedly somewhat narrower than that of the circuit shown in FIG. 3, but modern CMOS processes generally provide a sufficient choice of threshold voltages in order to configure the gate/source voltage of T2 appropriately. In the case of CMOS processes with separate trenches, it is also possible to make the threshold voltages adjustable by the use of appropriate bias voltage on the trench, and in this case the circuit shown in FIG. 4 generally presents no problems, since the drive for VB2 around the nominal value is only low, owing to the loop gain.

Figure 5:
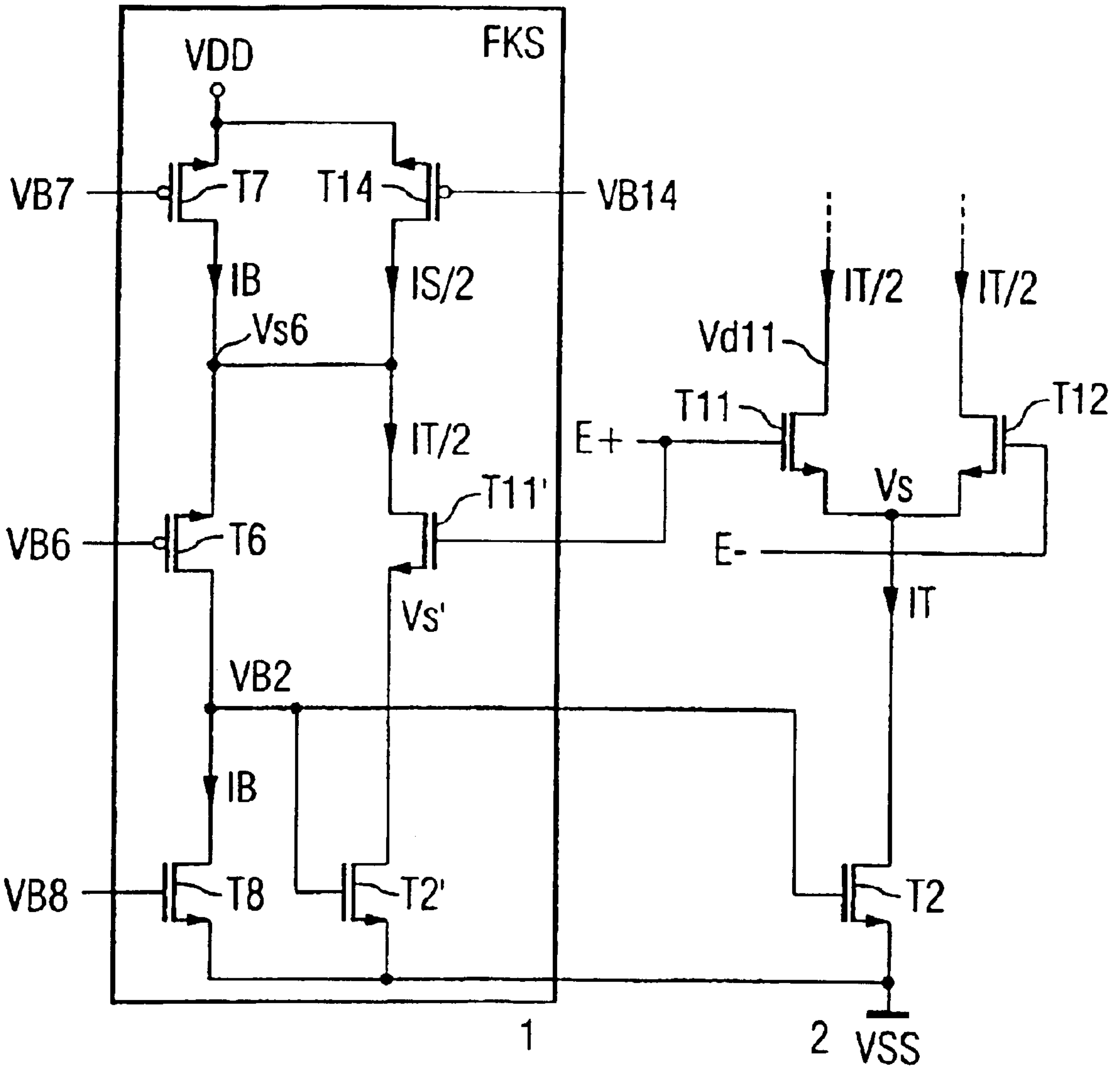

By way of example, FIG. 5 shows a further implementation variant of the circuit according to the invention, in which the current source IQ1 is formed by parallel-connected transistors T7 and T14. T7 feeds the operating current IB to the control loop, while T14 feeds it with the scaled nominal current IS/2. The current source IQ2 is implemented in the same way as in the previous exemplary embodiments, by a transistor T8, in this variant as well. In this case as well, and as in FIG. 4, T8 could also be equipped with a cascode transistor. The gate potentials VB7, VB8 and VB14 of the transistors T7, T8 and T14 may be obtained in a known manner from a current mirror circuit. The advantage of this implementation variant is that the nominal current is reflected once less than in the case of the previous variants, and is thus set more accurately.

The choice of the variant that forms the better solution in the end depends on the surrounding circuit.

FIG. 6 shows a second variant of the current control loop according to the invention, in which the voltages at both inputs E+, E− of the different stage are included in the regulation process. For this purpose, the first control transistor T11' in the previous circuits in FIGS. 2A, 2B, 3, 4, and 5 is connected in parallel with a second control transistor T12', whose gate is connected to the previously unused input of the difference stage. This ensures good replication of the common source potential Vs of the difference stage as the drain potential Vs' of the transistor T2'. In order to keep the current densities of the transistor pairs T11, T11' as well as T12, T12' and T2, T2' (which are essential for the replication process) the same, FIG. 6 uses, by way of example, a scaling of 1:1 of the transistors T2 and T2', and the control loop is supplied with the full nominal current IS. As long as the current densities match, however, virtually any desired scaling of the essential transistors is also possible, and this is restricted only by the fact that the mismatches between transistor pairs become worse as the transistor dimensions become smaller, since the accuracy of the regulation process depends on this match.

Figure 1C:
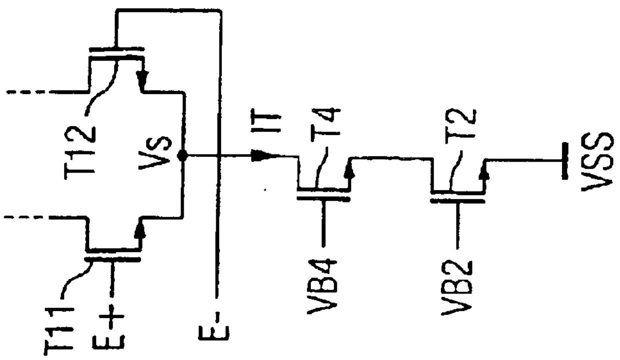
Prior Art FIG. 1C
FIGS. 1A, 1B, and 1C are circuit diagrams showing various embodiments of a configuration containing a differential pair and a foot current source for the differential pair according to the prior art.
Figure 1B:
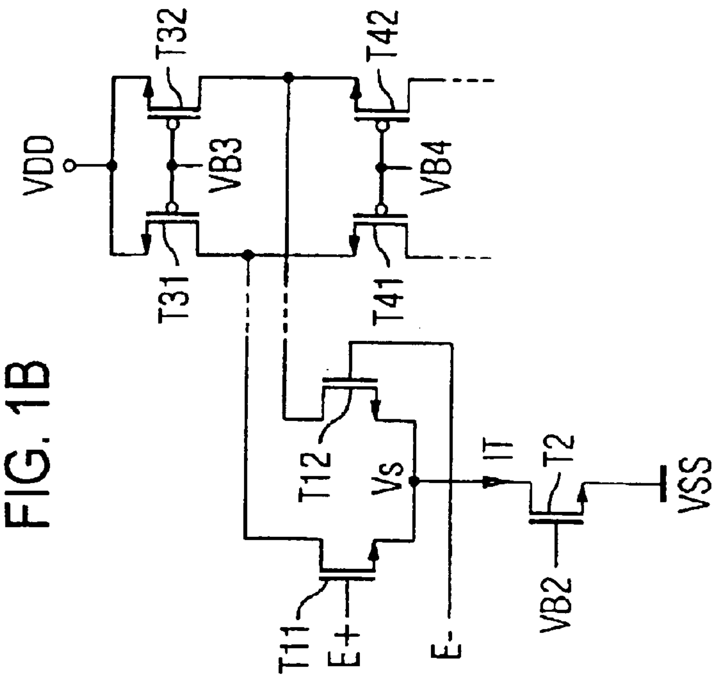
Prior Art FIG. 1B
Figure 1A:
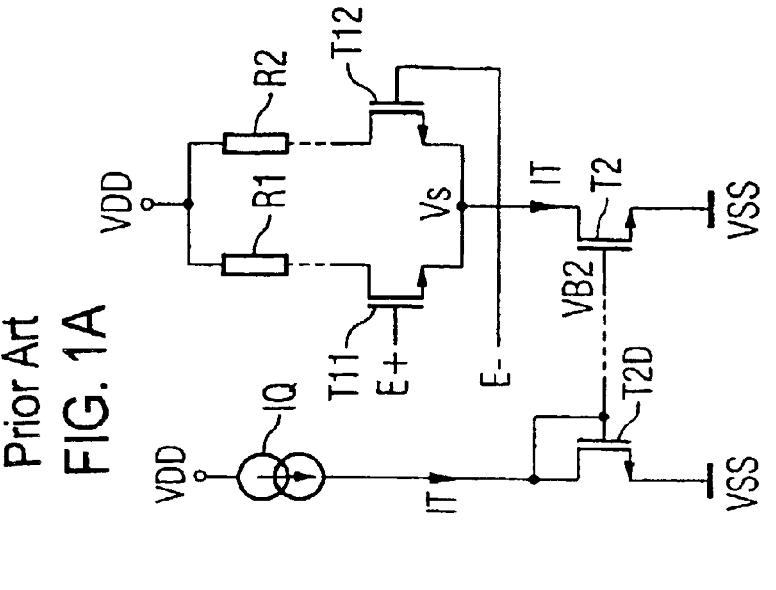
Prior Art FIG. 1A
Figure 7:
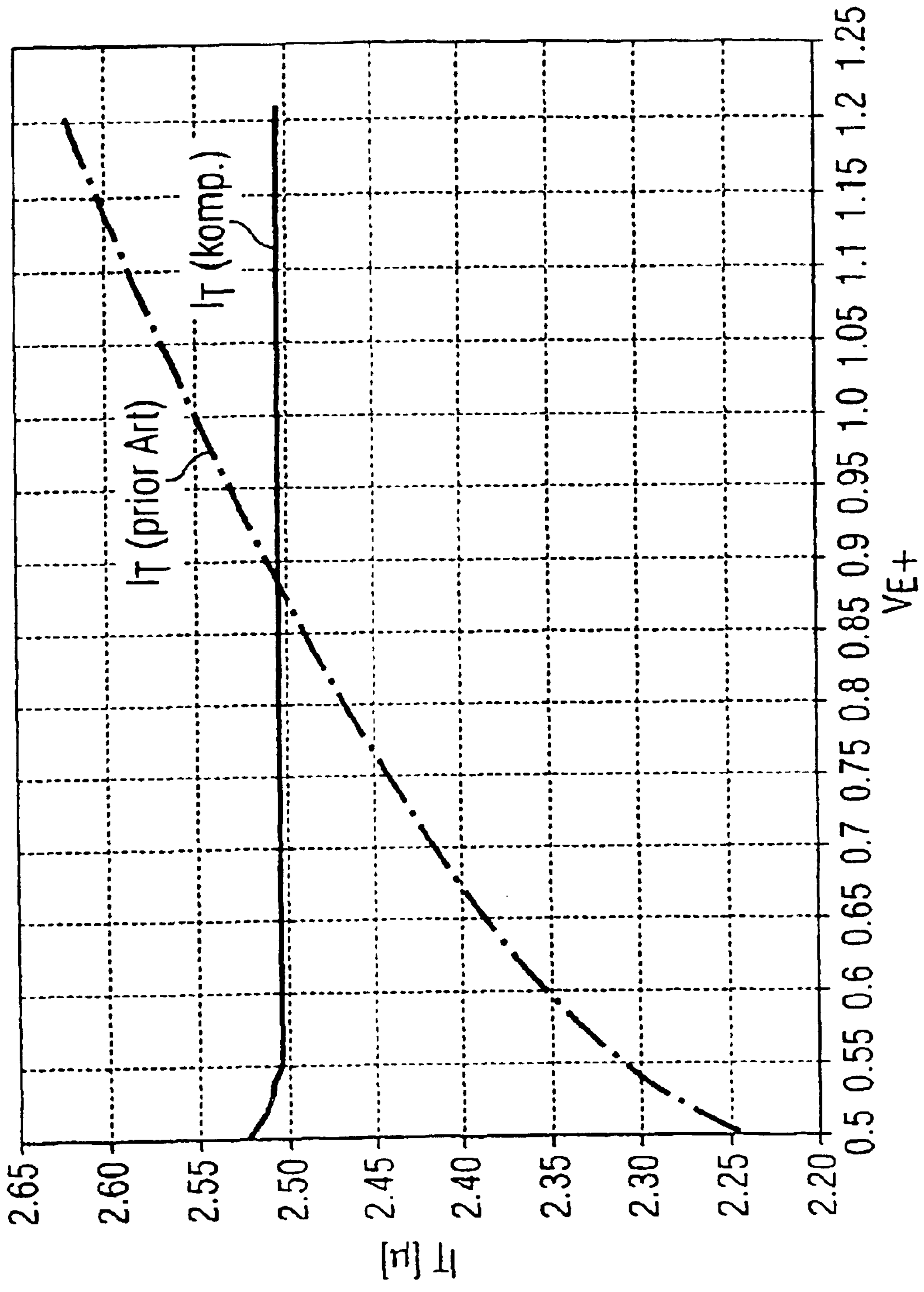
FIG. 7 is a graph showing currents emitted from conventional current source circuits and from one of the current source circuits described in more detail in the following text, in different conditions.

FIG. 7 shows a simulation result comparing the foot current IT(prior art) of a conventional foot current source as shown in FIGS. 1A and 1B and the foot current IT(Komp), whose error has been compensated for by the circuit according to the invention, via synchronized driving of the inputs E+ of a differential pair. The advantage of the circuit according to the invention should be obvious. A further advantage becomes evident when the synchronized drive is below 0.55 V: the curve admittedly starts to deviate from the ideal in this case, since the foot current source is moved to the triode range, so that the control loop gain falls. However, this discrepancy is considerably less than without the error compensation circuit according to the invention. Therefore, when using the error compensation circuit according to the invention, it is even possible to extend the synchronized drive range, since the current source transistor can be used into the triode range and not only in the saturated range.

The circuit according to the invention can be changed to a complementary circuit that operates in the same way by replacing n-channel transistors by p-channel transistors and vice versa, and by reversing the polarity of the supply voltage. It is also possible to use bipolar transistors instead of the MOSFET transistors in the figures.

In the situation where the error-compensated current source is a foot current source of a differential pair T11, T12, the gate or the base of the at least one control transistor T11' is preferably connected to the gate or base of a first transistor T11 in the differential pair.

In the situation where there is a second control transistor T12', its gate or base is preferably connected to the gate or base of the second transistor T12 in the differential pair, and its drain or collector is connected to the drain or collector of the first control transistor, with its source or its emitter in the same way being connected to the source or emitter of the first control transistor.

The described current source circuit is an error-compensated current source that is based on replication of the error in a current control loop. This allows high current source performance without cascoding the current source transistor.

I claim:

1. A current source circuit, comprising:

a component determining a magnitude of a current emitted from the current source circuit; and a control apparatus connected to and controlling said component, a control process being carried out in dependence on conditions prevailing in a unit supplied with the current from the current source circuit, said control apparatus containing a current replication path in which a given current is caused to flow corresponding to the current, a specific multiple of the current, or a specific fraction of the current fed to the unit supplied with the current from the current source circuit, said current replication path containing two transistors connected in series.

2. The current source circuit according to claim 1, wherein said component is a transistor.

3. A current source circuit, comprising:

a component transistor determining a magnitude of a current emitted from the current source circuit;

a control apparatus connected to and controlling said component transistor, a control process being carried out in dependence on conditions prevailing in a unit supplied with the current from the current source circuit;

said control apparatus contains a current replication path in which a given current is caused to flow corresponding to the current, a specific multiple of the current, or a specific fraction of the current fed to the unit supplied with the current from the current source circuit;

said current replication path contains a first transistor having a substrate, a first terminal selected from the group consisting of gate terminals and base terminals, a second terminal selected from the group consisting of drain terminals and collector terminals, and a third terminal selected from the group consisting of source terminal and emitter terminals, during operation of said first transistor said first, second and third terminals are substantially at a same potential with respect to said substrate as at corresponding connections of said component transistor governing the magnitude of the current emitted from the current source circuit.

4. The current source circuit according to claim 3, wherein said current replication path contains a second transistor having a terminal selected from the group consisting of a gate terminal and a base terminal, a drain or collector potential of said first transistor is set for driving said terminal of said second transistor in a suitable manner from the unit supplied with the current.

5. The current source circuit according to claim 4, wherein said control apparatus contains a regulation apparatus, and said current replication path outputs a replicated current fed to said regulation apparatus.

6. The current source circuit according to claim 5, wherein said regulation apparatus receives a nominal current, and said regulation apparatus readjusts the magnitude of the current emitted from the current source circuit and supplied to the unit such that the replicated current from said current replication path corresponds to the nominal current.

7. The current source circuit according to claim 5, wherein said regulation apparatus contains at least one third transistor.

8. A current source circuit, comprising:

a component determining a magnitude of a current emitted from the current source circuit;

a control apparatus connected to and controlling said component, a control process being carried out in dependence on conditions prevailing in a unit supplied with the current from the current source circuit;

said control apparatus is a control loop containing a first transistor, at least one second transistor, a third transistor, and at least two current sources;

said component has a control terminal and an output;

said first transistor having a first terminal selected from the group consisting of a gate terminal and a base terminal, a second terminal selected from the group consisting of a drain terminal and a collector terminal, and a third terminal selected from the group consisting of a source terminal and an emitter terminal;

said second transistor having a first terminal selected from the group consisting of a gate terminal and a base terminal, a second terminal selected from the group consisting of a drain terminal and a collector terminal, and a third terminal selected from the group consisting of a source terminal and an emitter terminal;

said third transistor having a first terminal selected from the group consisting of a gate terminal and a base terminal, a second terminal selected from the group consisting of a drain terminal and a collector terminal, and a third terminal selected from the group consisting of a source terminal and an emitter terminal;

said second terminal of said first transistor connected to said third terminal of said second transistor;

said second terminal of said second transistor connected to a first of said current sources and said third terminal of said third transistor;

said second terminal of said third transistor connected to a second of said current sources, to said first terminal of said first transistor and to said control terminal of said component governing the magnitude of the current emitted from the current source circuit;

said first and second current sources being used to supply a nominal current and to supply and return an operating current for said control loop; and said first terminal of said second transistor being driven such that a potential at said second terminal of said first transistor is substantially a same as that at said output of said component.

* * * * *

UNITED STATES PATENT AND TRADEMARK OFFICE

CERTIFICATE OF CORRECTION

PATENT NO. : 6,885,220 B2
DATED : April 26, 2005
INVENTOR(S) : Bernhard Engl

It is certified that error appears in the above-identified patent and that said Letters Patent is hereby corrected as shown below:

Column 7,
Line 62, should read as follows:
-- terminals and emitter terminals, during operation of said --

Signed and Sealed this

Nineteenth Day of July, 2005

JON W. DUDAS
*Director of the United States Patent and Trademark Office*